US012693352B1

(12) United States Patent
Verploegh et al.

(10) Patent No.: US 12,693,352 B1
(45) Date of Patent: Jul. 28, 2026

(54) COMPACT INTEGRATED VACUUM CELLS USABLE WITH QUANTUM RF SENSOR TECHNOLOGIES

(71) Applicant: ColdQuanta, Inc., Boulder, CO (US)

(72) Inventors: Shane A. Verploegh, Boulder, CO (US); Eric Magnuson Bottomley, Broomfield, CO (US); Ying-Ju Wang, Broomfield, CO (US); Haoquan Fan, Erie, CO (US); Seth Charles Caliga, Lafayette, CO (US); Michelle Warter, Westminster, CO (US)

(73) Assignee: ColdQuanta, Inc., Boulder, CO (US)

( * ) Notice: Subject to any disclaimer, the term of this patent is extended or adjusted under 35 U.S.C. 154(b) by 195 days.

(21) Appl. No.: 18/767,721

(22) Filed: Jul. 9, 2024

Related U.S. Application Data

(60) Provisional application No. 63/525,939, filed on Jul. 10, 2023.

(51) Int. Cl.
*G01R 33/26* (2006.01)
(52) U.S. Cl.
CPC ................................... *G01R 33/26* (2013.01)
(58) Field of Classification Search
CPC ..................................................... G01R 33/26
See application file for complete search history.

(56) References Cited

U.S. PATENT DOCUMENTS 12,032,010 B1 * 7/2024 Caliga ................ G01R 29/0878

OTHER PUBLICATIONS

David Sarkisyan, A. Sarkisyan, Jocelyne Guena, Michel Lintz, Marie-Anne Bouchiat An Alkali-Vapor Cell With Metal Coated Windows for Efficient Application of an Electric Field, https://hal. science/Hal-00004629v1 (Year: 2005).*
Simons et al., Waveguide-integrated Rydberg Atom-based RF Field Detector for Near-field Antenna Measurements, Oct. 2019.

* cited by examiner

*Primary Examiner* — G.M. M. Hyder
(74) *Attorney, Agent, or Firm* — Schwegman Lundberg & Woessner, P.A.

(57) ABSTRACT

A radio frequency (RF) radiation detection system is described. The RF detection system includes a metallic vacuum cell including a dispenser chamber and an interaction chamber. The dispenser chamber is configured to retain a quantum particle source. The interaction chamber is communicatively coupled with the dispenser chamber. The interaction chamber has aperture(s) therein and is configured to support the RF radiation. RF radiation access window(s) are connected with and hermetically seal the aperture(s).

18 Claims, 5 Drawing Sheets

300

401

500

510
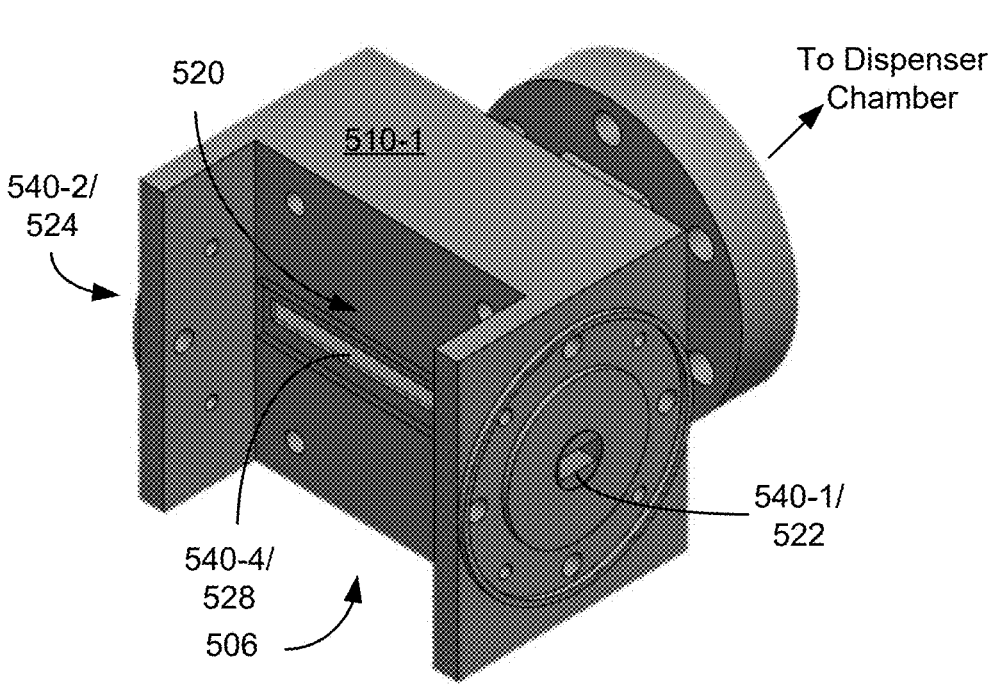
FIG. 5B
510-1                                        510-1
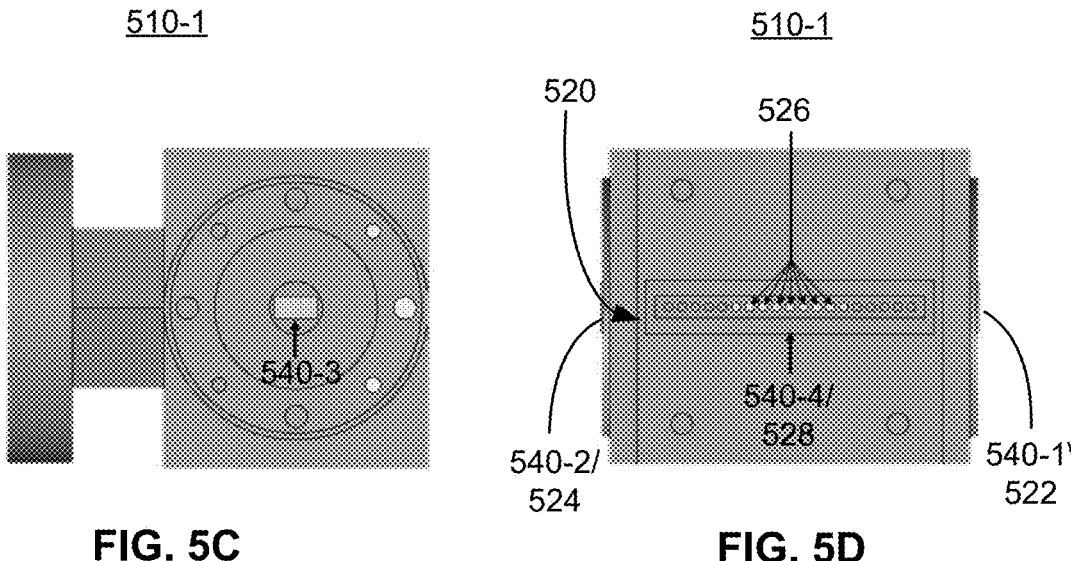
FIG. 5C                                  FIG. 5D

600

602
Direct RF Radiation to Interaction Chamber Having Quantum Particles Excited to a First Rydberg State 604
Quantum Particles Interact with RF Radiation (Transition to Second Rydberg State Based on Frequency of RF Radiation)

606
Detect RF Signal Based on Interaction (Transition)

COMPACT INTEGRATED VACUUM CELLS USABLE WITH QUANTUM RF SENSOR TECHNOLOGIES

CROSS REFERENCE TO OTHER APPLICATIONS

This application claims priority to U.S. Provisional Patent Application No. 63/525,939 entitled ENHANCED PATH LENGTH THROUGH A RESONATOR AND OTHER QUANTUM RF SENSOR TECHNOLOGIES filed Jul. 10, 2023 which is incorporated herein by reference for all purposes.

GOVERNMENT LICENSE RIGHTS

This invention was made with government support under Grant 80NSSC23K0517 awarded by NASA. The government has certain rights in the invention.

BACKGROUND OF THE INVENTION

Conventional radio frequency (RF) detectors utilize antennas in order to detect RF radiation (i.e. RF signals). These antennas scale with the wavelengths to be detected. Thus, longer antennas are used to detect RF signals having longer wavelengths. This adversely affects the size, weight, and power (SWAP) requirements of RF detectors, particularly RF detectors configured to detect long wavelengths (e.g. RF detectors for longer wavelengths or wideband RF detectors in which the band includes longer wavelengths requiring longer antennas). As a result, certain conventional RF detectors may not be deployed for on-board navigation, space, and/or other applications. Moreover, the sensitivity of such conventional RF detectors can be insufficient for some purposes.

Quantum RF detectors may provide greater sensitivity and may not scale with the wavelength RF radiation detected. For example, such quantum RF detectors typically use a glass cell in which the vapor of quantum particles (e.g. atoms of an alkali metal) reside. Such cells may be placed in a cavity or waveguide that directs RF radiation toward the cell. The interaction of the RF radiation and the quantum particles may be detected, for example via fluorescence of the quantum particles or electromagnetically induced transparency (EIT) of a probe laser beam. However, improvements in the robustness and sensitivity may be desired. For example, some such quantum RF detectors are limited to the laboratory environment. Further, losses may adversely affect the ability of such quantum RF detectors to adequately sense RF radiation. Consequently, a deployable quantum RF detector having the requisite sensitivity is desired.

BRIEF DESCRIPTION OF THE DRAWINGS

Various embodiments of the invention are disclosed in the following detailed description and the accompanying drawings.

FIGS. 5A-5D are diagrams depicting an embodiment of a portion of a quantum RF detector.

DETAILED DESCRIPTION

Figure 1:
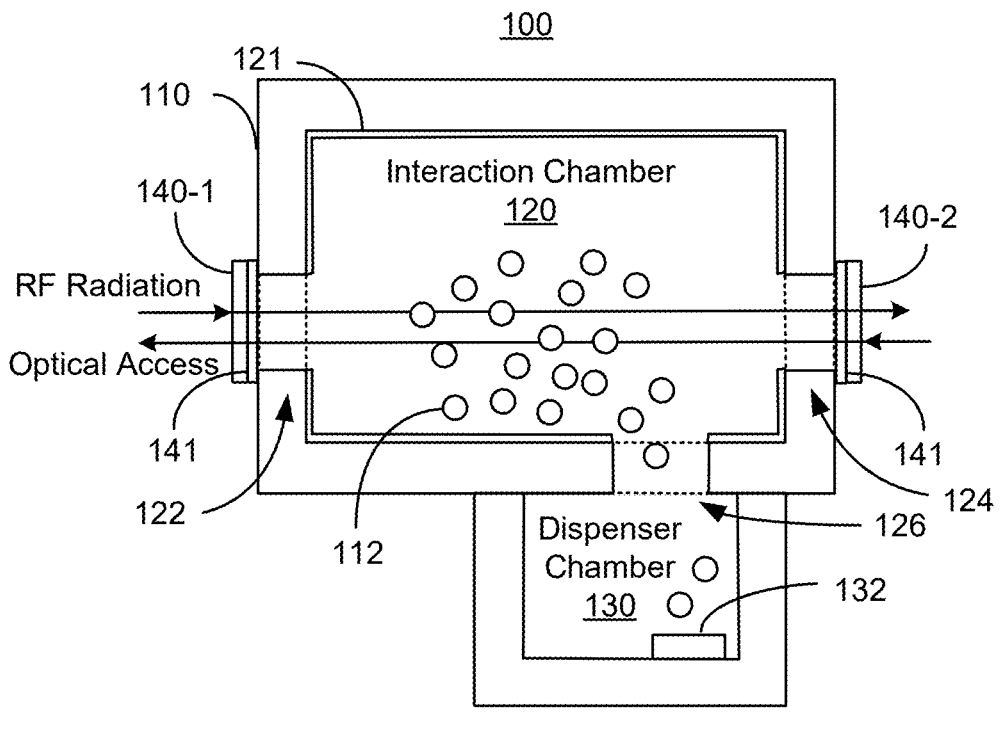
FIG. 1 is a diagram of an embodiment of a compact integrated vacuum cell usable with quantum RF detectors.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A radio frequency (RF) radiation detection system is described. The RF detection system includes a metallic vacuum cell including a dispenser chamber and an interaction chamber. The vacuum cell is hermetically sealed. The dispenser chamber is configured to retain a quantum particle source. The interaction chamber is communicatively coupled with the dispenser chamber. Thus, quantum particles emitted by the quantum particle source may reach the interaction chamber. The interaction chamber has aperture(s) therein and is configured to support the RF radiation. RF radiation access window(s) are connected with and hermetically seal the aperture(s).

In some embodiments, the interaction chamber includes at least one optical access window. In some embodiments, the optical access window(s) are a portion of (e.g. may be the same as) the RF access window(s). In some embodiments, the interaction chamber includes a coating having a conductivity greater than a metallic vacuum cell conductivity. The RF radiation access window(s) may include a barrier layer. The barrier layer reduces absorption of quantum particles by the RF radiation access window(s). The metallic vacuum cell may further include an ion pump coupled with the dispenser chamber and the interaction chamber. The interaction chamber may be configured as a resonator or as a waveguide for the RF radiation. In some such embodiments, the interaction chamber is configured as the waveguide. The metallic vacuum cell may also be coupled with RF waveguide(s).

A radio frequency (RF) radiation detection system is described. The RF detection system includes an RF waveguide and a stainless steel vacuum cell coupled with the RF waveguide. The stainless steel vacuum cell includes dispenser chamber and an interaction chamber and is hermetically sealed. The dispenser chamber is configured to retain a quantum particle source. The interaction chamber is communicatively coupled with the dispenser chamber. The interaction chamber has aperture(s) therein and is configured to support the RF radiation. The interaction chamber includes a copper coating. Glass RF radiation access window(s) are coupled with and hermetically seal the aperture(s). The glass RF radiation access window(s) have a barrier layer. The barrier layer may prevent or reduce alkali absorption and/or aggregation.

A method for detecting RF radiation is described. The method includes directing RF radiation to an interaction chamber of a hermetically sealed metallic vacuum cell. The metallic vacuum cell includes the interaction chamber and a dispenser chamber. The dispenser chamber is configured to retain a quantum particle source. The dispenser chamber is communicatively coupled with the interaction chamber. The interaction chamber has at least one aperture therein and is configured to support the RF radiation. The RF radiation is transmitted into the interaction chamber through RF radiation access window(s) that are coupled with and hermetically seal the aperture(s). The RF radiation interacts with quantum particles in the interaction chamber. The method also includes detecting the RF radiation based on an interaction between the quantum particle and the RF radiation.

FIG. 1 is a diagram of an embodiment of a compact integrated vacuum cell 100 usable with quantum RF detectors. For clarity, FIG. 1 is not to scale and only portions of vacuum cell 100 are shown. Vacuum cell 100 includes metallic housing 110 having interaction chamber 120 and dispenser chamber 130 therein. Chambers 120 and 130 are vacuum chambers. For example, in some embodiments, chamber(s) 120 and/or 130 may be pumped to high vacuum (HV) and/or ultra-high vacuum (UHV). For example, chambers 120 and/or 130 may be pumped to $10^{-9}$ Torr or less. In some embodiments, chambers 120 and/or 130 may be pumped to $10^{-10}$ Torr or less.

Metallic housing 110 is a metal and, therefore, conductive. In some embodiments, metallic housing 110 may include or consist of metal(s) such as stainless steel, copper, aluminum, and/or titanium. In some embodiments, metallic housing 110 may include multiple portions that are connected together. For example, interaction chamber 120 and dispenser chamber 130 may be separate pieces that can be bolted together. Metallic housing 110 may be fabricated via 3D-printing, for example using 3D printed stainless steel. Interaction chamber 120 of vacuum cell 100 is desired to support RF radiation (e.g. to reduce losses for RF radiation). To improve this feature of vacuum cell 100, a higher conductivity coating 121 may be provided on metallic housing 110. For example, a copper coating 121 may be on stainless steel metallic housing 110. High conductivity coating 121 may allow for improved propagation of the RF radiation through interaction chamber 120. In some embodiments, the portion of metallic housing 110 used in providing interaction chamber 120 may have dimension(s) (e.g. height, width, and/or length) that are at least twenty millimeters and not more than one hundred millimeters. In some embodiments, the dimension(s) are not more than fifty millimeters.

In some embodiments, the dimension(s) are at least twenty-five millimeters and not more than thirty-five millimeters. The portion of metallic housing 110 used in providing dispenser chamber 130 may have dimensions in the same ranges.

Dispenser chamber 130 includes source 132 of quantum particles 112 (of which only one in interaction chamber 120 is labeled). Quantum particles 112 are entities that exhibit quantum mechanical properties, such as transitions between energy levels of an atom. Quantum particles 112 may be atoms of an alkali metal (e.g. Cs and/or Rb). Source 132 may include a film of alkali metal on the inner walls of dispenser chamber 130 or a solid pill of the alkali metal. Other species (e.g. other alkali metals) and other phases of source materials might be used in some embodiments. The alkali metal or other material source 132 in dispenser chamber 130 is such that the desired quantity and/or density of quantum particles 112 is present in interaction chamber 120 during use of a quantum RF detector employing vacuum cell 100. Further, source 132 in dispenser chamber 130 provides quantum particles 112 having the desired quantum mechanical properties. For example, quantum particles 112 have the desired energy states for functioning of the quantum RF detector. Dispenser chamber 130 is communicatively coupled with interaction chamber 120 via aperture, or channel 126. Although channel 126 is shown as a simple aperture, in some embodiments, channel 126 may have a different and/or more complicated structure. Thus, dispenser chamber 130 is fluidically coupled with interaction chamber 120, allowing quantum particles 112 emitted by source 132 to travel into interaction chamber 120. The vapor pressure of the alkali metal provides the quantum particles 112 in dispenser chamber 130, which travel into interaction chamber 120 via the fluidic connection 126.

Interaction chamber 120 encloses a vapor of quantum particles 112. In some embodiments, interaction chamber 230 includes but minimal (or no) other species. Interaction chamber 120 includes apertures 122, 124, and 126 therein. Apertures 122, 124, and 126 allow access into interaction chamber 120. Aperture/channel 126 may be open, allowing for quantum particles to travel between dispenser chamber 130 and interaction chamber 120. Apertures 122 and 124 are hermetically sealed by windows 140-1 and 140-2 (collectively or generically 140). In some embodiments, windows 140 are epoxied to the outside of metallic housing 110. Windows 140 allow for RF radiation to access interaction chamber 120. Thus, windows 140 may be considered RF radiation windows. In some embodiments, windows 140 also allow optical access to interaction chamber 120. For example, a laser beam may traverse interaction chamber 120 via windows 140 (e.g. enter through window 140-1 and exit through window 140-2, or vice versa). In the embodiment shown, therefore, optical and RF radiation access to interaction chamber 120 is provided via the same windows 140. In some embodiments, optical access and RF radiation access may be provided by different windows.

In some embodiments, windows 140 have barrier layer 141. Barrier layer 141 may be a coating that is deposited on windows 140. For example, barrier layer 140 may be or include aluminum oxide that may be deposited via chemical-vapor deposition or using another technique. Barrier layer 141 may reduce or prevent diffusion of quantum particles 112 into windows 140. In addition, windows are small. For example, the height and width (perpendicular to the plane of the page in FIG. 1) may each be at least 2 millimeters and not more than twenty millimeters. In some embodiments, the height and width of each window 140 is at least three millimeters and not more than ten millimeters. Windows 140 are also thin. For example, windows 140 may each have a thickness of at least fifty micrometers and not more than five hundred micrometers. In some embodiments, windows 140 may each be at least one hundred and fifty micrometers and not more than two hundred and fifty micrometers (e.g. nominally two hundred micrometers) thick.

In operation, source 132 in dispenser chamber 130 is activated after chamber(s) 120 and/or 130 have been evacuated to HV or UHV pressures. For example, source 132 may be heated. Thus, quantum particles 112 are emitted from source 132 and form a vapor in interaction chamber 120. In addition, quantum particles 112 may be tuned for particular frequencies of RF radiation. For example, quantum particles 112 may be placed in an excited state (e.g. a Rydberg state) such that transitions between energy levels of a quantum particle correspond to the desired RF radiation frequency.

RF radiation (i.e. an RF signal) is directed toward interaction chamber 120 and enters via window(s) 140. In some embodiments, aperture 122 may be coupled with an antenna or other mechanism for guiding RF radiation toward interaction chamber 120. Interaction chamber 120 may be configured as a waveguide. For example, the RF radiation may be guided into interaction chamber 120 via window 140-1, through interaction chamber 120, and out through opposing window 140-2. Thus, interaction chamber 120 supports the RF radiation. High conductivity coating 121 may improve the ability of interaction chamber 120 to support the RF radiation with reduced losses. The RF radiation interacts with quantum particles 112 in interaction chamber 120. For example, the RF radiation may cause quantum particles to transition between energy states. Via this interaction, the RF radiation may be detected. For example, the optical access via window(s) 140 may allow for a probe laser beam to transit interaction chamber 120. Electromagnetically induced transparency (EIT) of such a probe laser beam may be used to detect the RF radiation. In some embodiments, quantum particles may fluoresce. The fluorescence emitted may exit interaction chamber 120 through window(s) 140 and be captured by an optical detector (not shown in FIG. 1). Thus, EIT or atomic fluorescence may be used to detect the RF radiation. In other embodiments, additional and/or other techniques might be used.

Using vacuum cell 100, detection of RF radiation may be improved. Because vacuum cell 100 is metallic, vacuum cell 100 may be more robust than a conventional glass cell while remaining small. Thus, a quantum RF detector using vacuum cell 100 may be more readily deployable in a vehicle (e.g. a satellite, an aircraft, or an automobile). In addition, vacuum cell 100 may include multiple portions that may be separately manufactured and readily assembled (e.g. via bolting together pieces at flanges). In addition, vacuum cell 100 may be fabricated using techniques such as 3D printing of stainless steel. Consequently, the desired configuration of chambers 120 and 130 may be more readily obtained. Fabrication of the quantum RF detector may thus be facilitated. Use of high conductivity coating 121 (or conductive metallic housing 110) may improve the ability of interaction chamber 120 to support RF radiation. For example, interaction chamber may have significantly lower losses than a conventional glass vacuum chamber. Because windows 140 may be small and thin (e.g. nominally two hundred micrometers in thickness and occupy a small fraction of interaction chamber 120), losses due to RF radiation entering and/or leaving interaction chamber 120 may be small. Distortion of the RF field may also be reduced. Further, a larger fraction of interaction chamber 120 may better support the RF radiation with lower losses. Sensitivity of the quantum RF detector may be enhanced. Consequently, the performance, manufacturability, and robustness of a quantum RF detector using metallic vacuum cell 100 may be improved.

Figure 2:
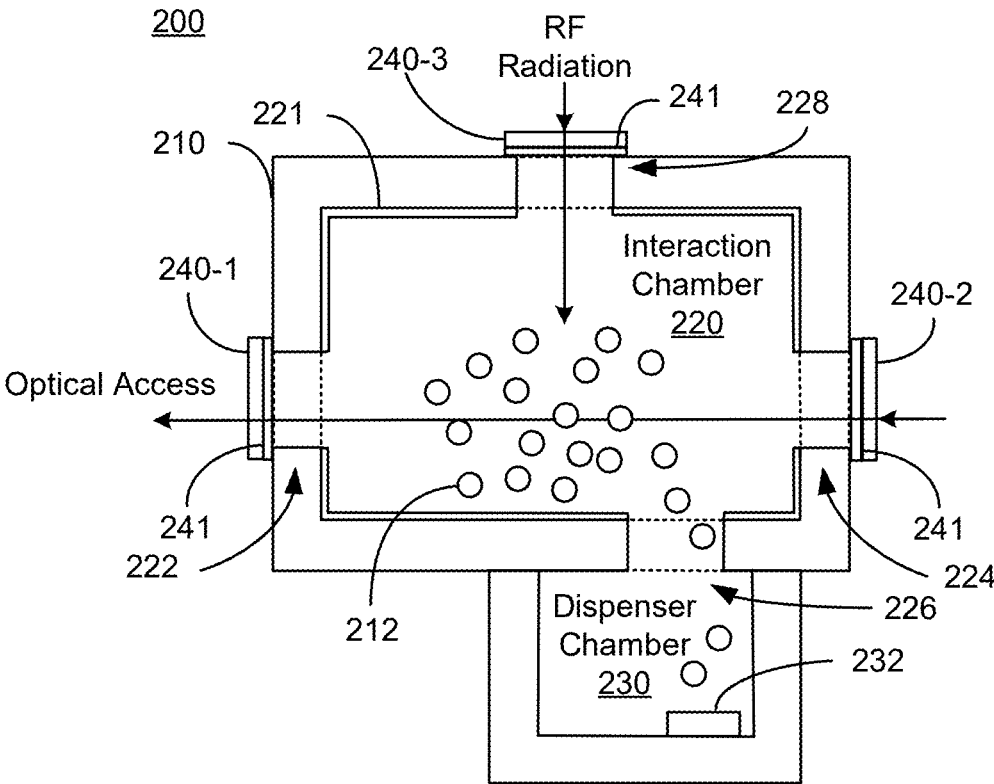
FIG. 2 is a diagram of an embodiment of a compact integrated vacuum cell usable with quantum RF detectors.

FIG. 2 is a diagram of an embodiment of compact integrated, metallic vacuum cell 200 usable with quantum RF detectors. For clarity, FIG. 2 is not to scale and only portions of vacuum cell 200 are shown. Vacuum cell 200 includes metallic housing 210 having interaction chamber 220 and dispenser chamber 230 therein. Vacuum cell 200 is analogous to vacuum cell 100. Thus, metallic housing 210, interaction chamber 220, and dispenser chamber 230 are analogous to metallic housing 110, interaction chamber 120, and dispenser chamber 130, respectively. For example, the materials and sizes of metallic housing 210, interaction chamber 220, and dispenser chamber 230 are analogous to those of metallic housing 110, interaction chamber 120, and dispenser chamber 130, respectively. High conductivity layer 221 of interaction chamber 220, channel/aperture 226, and source 232 of dispenser chamber 230 are analogous to high conductivity layer 121, channel/aperture 126, and source 132, respectively.

Interaction chamber 220 includes apertures 222, 224, and 228. Apertures 222 and 224 are analogous to apertures 122 and 124. Thus, optical access may be provided via apertures 222 and 224. Additional aperture 228 provides separate access to interaction chamber 220 for RF radiation. Windows 240-1, 240-2, and 240-3 (collectively or generically windows 240) are also shown. Windows 240 are analogous to windows 140. Similarly, barrier layers 241 for each window 240 may be analogous to barrier layer 141. Thus, windows 240 may have analogous dimensions to windows 140 and may use aluminum oxide as barrier layers 241.

In some embodiments, interaction chamber 220 may be configured as a resonator cavity. Thus, RF radiation is provided via window 240-3 and aperture 228 along a different axis from the optical access provided through windows 240-1 and 240-2 and apertures 222 and 224. In some embodiments, aperture 228 may be coupled with an antenna or other mechanism for guiding RF radiation. In some embodiments, windows 240-1 and/or 240-2 may be partially metallized in order to improve performance of interaction chamber 220 as a resonator.

Vacuum cell 200 operates in an analogous manner to vacuum cell 100. Source 232 is activated, allowing quantum particles 212 having the desired properties to form a vapor in interaction chamber 220. Quantum particles 212 are analogous to quantum particles 112. RF radiation is directed toward interaction chamber 220 and enters via window 240-3. Interaction chamber 220 may be configured as a resonator. Thus, interaction chamber 220 supports the RF radiation. High conductivity coating 221 may improve the ability of interaction chamber 220 to support the RF radiation with reduced losses. The RF radiation interacts with quantum particles 212. For example, the RF radiation may cause quantum particles to transition between energy states. Via this interaction, the RF radiation may be detected. For example, the optical access via window(s) 240 may allow for a probe laser beam to transit interaction chamber 220. EIT of such a probe laser beam may be used to detect the RF radiation. In some embodiments, quantum particles may fluoresce. The fluorescence emitted may exit interaction chamber 220 through window(s) 240 and be captured by an optical detector (not shown in FIG. 2). Thus, EIT or atomic fluorescence may be used to detect the RF radiation. In other embodiments, additional and/or other techniques might be used.

Vacuum cell 200 may share the benefits of vacuum cell 100. For example, because vacuum cell 200 is metallic, vacuum cell 200 may be more robust and easier to fabricate than a conventional glass cell while remaining small. Thus, a quantum RF detector using vacuum cell 200 may be more readily deployable. Use of high conductivity coating 221 (or conductive metallic housing 210) may reduce RF losses. Because windows 240 may be small and thin losses and/or distortions due to RF radiation entering and/or leaving interaction chamber 220 may be reduced. Consequently, the performance, manufacturability, and robustness of a quantum RF detector using metallic vacuum cell 200 may be improved.

Figure 3:
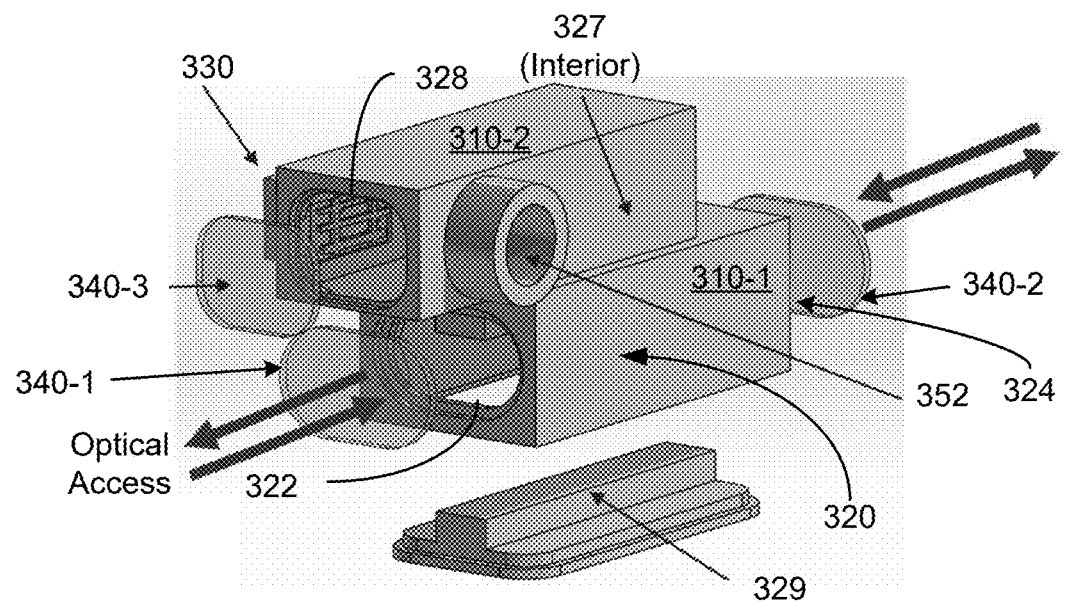
FIG. 3 is a perspective view of an embodiment of a compact integrated vacuum cell usable with quantum RF detectors.

FIG. 3 is a perspective view of an embodiment of compact integrated vacuum cell 300 usable with quantum RF detectors. For clarity, FIG. 3 is not to scale and only portions of vacuum cell 300 are shown. Vacuum cell 300 includes metallic housing 310 having portions 310-1 and 310-2, interaction chamber 320 and dispenser chamber 330. Vacuum cell 300 is analogous to vacuum cell(s) 100 and/or 200. Thus, metallic housing 310, interaction chamber 320, and dispenser chamber 330 are analogous to metallic housing 110 and/or 210, interaction chamber 120 and/or 220, and dispenser chamber 130 and/or 230, respectively. For example, the materials and sizes of metallic housing 310, interaction chamber 320, and dispenser chamber 330 are analogous to those of metallic housing 110, interaction chamber 120, and dispenser chamber 130, respectively. Although not explicitly shown, a high conductivity layer and a barrier layer that are analogous to high conductivity layer 121 and/or 221 and barrier layer 141 and/or 241 may be present.

Interaction chamber 320 includes apertures 322, 324, and 328 that are analogous to apertures 222, 224, and 228. Windows 340-1, 340-2, and 340-3 (collectively or generically 340) are most analogous to windows 240-1, 240-2, and 240-3. Thus, optical access is provided via windows 340-1 and 340-2 and apertures 322 and 324, while RF radiation access is provided via window 340-3 and aperture 328. In some embodiments, aperture 328 may be coupled with an antenna or other mechanism for guiding RF radiation. Interior aperture/channel 327 (interior to metallic housing and having a location indicated by the arrow) is also present. Interior aperture 327 allows RF radiation entering via window 340-3 to enter into the lower portion of interaction cavity 320. Aperture 352 may be an access port that allows interaction cavity 320 to be coupled with a vacuum pump (not shown in FIG. 3), such as an ion pump. Thus, interaction cavity 320 may be pumped via aperture 352 to HV or UHV pressures. Interaction chamber 320 also includes cavity corrugations 329. In some embodiments, cavity corrugations 329 may be used to determine the frequency and/or bandwidth of the quantum RF detector with which vacuum cell 100 is used. In some embodiments, cavity corrugations 329 may be omitted. In some embodiments, interaction chamber 320 may be configured as a resonator cavity. Thus, RF radiation is provided via window 340-3 and aperture 328 along a different axis from the optical access provided through windows 340-1 and 340-2 and apertures 322 and 324.

Vacuum cell 300 operates in an analogous manner to vacuum cell 200. Consequently, vacuum cell 300 may share the benefits of vacuum cell 200 and/or 100. For example, because vacuum cell 300 is metallic, vacuum cell 300 may be more robust and easier to fabricate than a conventional glass cell while remaining small. A quantum RF detector using vacuum cell 300 may be more readily deployable. Use of a high conductivity coating (or conductive metal housing 310) may reduce RF losses. Because windows 340 may be small and thin losses and/or distortions due to RF radiation entering and/or leaving interaction chamber 320 may be reduced. Consequently, the performance, manufacturability, and robustness of a quantum RF detector using metallic vacuum cell 300 may be improved.

Figure 4:
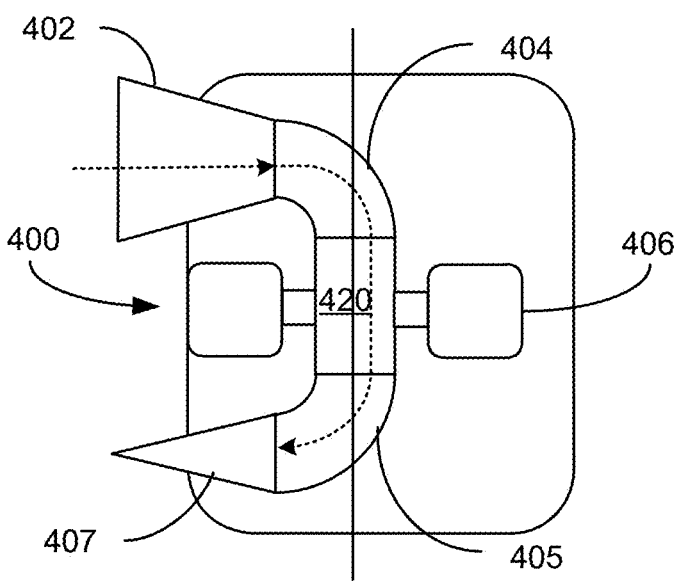
FIG. 4 is a diagram of an embodiment of a quantum RF detector including a compact integrated vacuum cell.

FIG. 4 is a diagram of an embodiment of quantum RF detector 401 including a compact integrated vacuum cell 400. For clarity, FIG. 4 is not to scale and only portions of quantum RF detector 401 are shown. Quantum RF detector 401 includes antennae 402, waveguides 404 and 405, collection optics 406, RF load 407, and vacuum cell 400. Vacuum cell 400 includes interaction chamber 420 configured as part of waveguides 404 and 405. The dashed line in FIG. 4 indicates the path of the RF signal. Vacuum cell 400 is analogous to vacuum cells 100, 200, and/or 300.

RF detector 401 functions in a manner analogous to that described in the context of vacuum cells 100, 200, and 300. Antennae 402 is used to direct the RF radiation to waveguide 404. Waveguide 404 directs the RF radiation to interaction chamber 420. RF radiation exiting interaction chamber 420 is provided to waveguide 405. RF radiation interacts with quantum particles (not shown) in interaction chamber 420. Collection optics 406 may be used to collect the atomic fluorescence generated in interaction chamber 420.

RF detector 401 may share the benefits described in the context of vacuum cells 100, 300, and/or 300. For example, because vacuum cell 400 is metallic, vacuum cell 400 may be more robust and easier to fabricate than a conventional glass cell while remaining small. Quantum RF detector 401 may be more readily deployable. Use of a high conductivity coating (or the conductive metal housing) of vacuum cell 400 may reduce RF losses. Because windows (not shown in FIG. 4) may be small and thin, losses and/or distortions due to RF radiation entering and/or leaving interaction chamber 420 may be reduced. Consequently, the performance, manufacturability, and robustness of quantum RF detector 401 using metallic vacuum cell 400 may be improved.

Figure 5A:
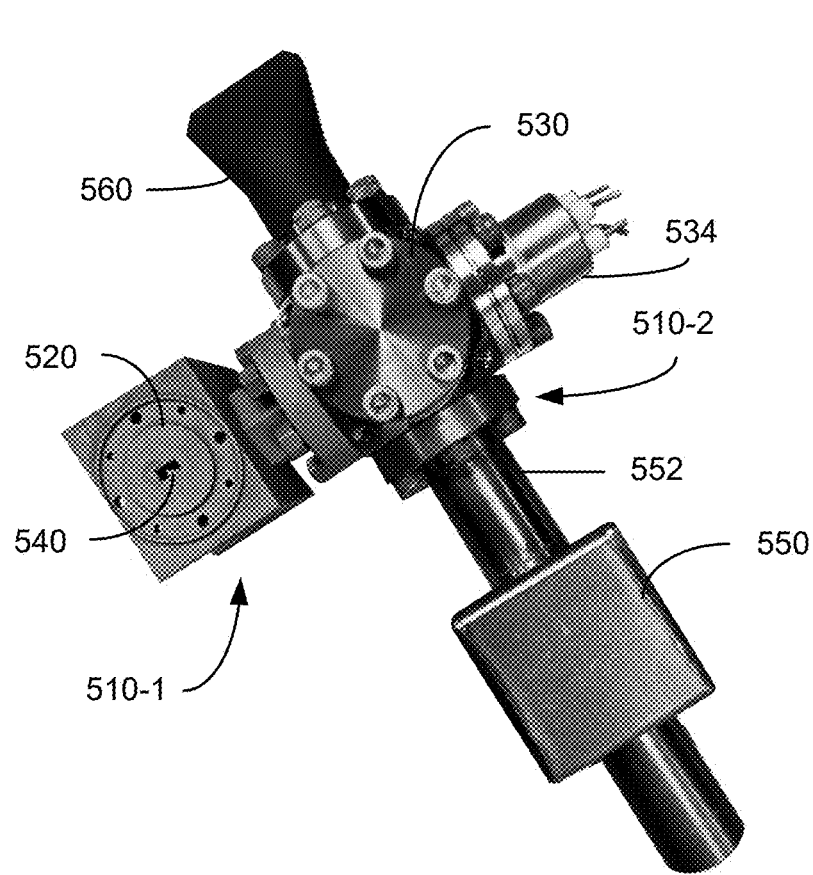

FIGS. 5A-5D are diagrams depicting an embodiment of a portion of a quantum RF detector. More specifically, an integrated vacuum cell 500 is shown. FIG. 5A depicts a perspective view of integrated vacuum cell 500. FIG. 5B depicts a perspective view of a portion of integrated vacuum cell 500. FIGS. 5C and 5D depict side views of a portion of integrated vacuum cell 500. For clarity, FIGS. 5A-5D are not to scale and only portions of vacuum cell 500 are shown. Referring to FIGS. 5A-5D, vacuum cell 500 includes metallic housing 510 having portions 510-1 and 510-2 (collectively or generically 510), interaction chamber 520 (interior to the pieces shown), and dispenser chamber 530 (interior to the pieces shown). Vacuum cell 500 is analogous to vacuum cell(s) 100, 200, 300, and/or 400. Thus, metallic housing 510, interaction chamber 520, and dispenser chamber 330 are analogous to metallic housing 110, 210, and/or 310, interaction chamber 120, 220, 320, and/or 420, and dispenser chamber 130, 230, and/or 330, respectively. For example, the materials and sizes of metallic housing 510, interaction chamber 520, and dispenser chamber 530 are analogous to those of metallic housing 110, 210, and/or 310, interaction chamber 120, 220, and/or 320, and dispenser chamber 130, 230, and/or 330, respectively. Although not explicitly shown, a high conductivity layer and a barrier layer that are analogous to high conductivity layer 121 and/or 221 and barrier layer 141 and/or 241 may be present.

Also shown are source electronics 534, ion pump 550, and channel 552 coupling ion pump 550 to source chamber 530 (e.g. remaining portions of vacuum cell 500). Source electronics 534 may be used to activate the source of quantum particles. Also shown is connector 560 that may be coupled to a pump during fabrication of vacuum cell 500. Connector 560 allows a pump (not shown) to be used to evacuate chambers 520 and 530. Connector 560 may then be tipped off to seal vacuum cell 500. Also shown is optical collection region 506 (depicted in FIG. 5B). Collection optics analogous to collection optics 406 may be coupled to vacuum cell 500 at optical collection region 506.

Interaction chamber 520 includes apertures 522, 524, and 526 that are analogous to apertures 122, 124, and 126. Apertures 526 are shown in FIG. 5D through aperture 528. Windows 540-1, 540-2, and 540-4 (collectively or generically 540) are present. Windows 540-1 and 540-2 are most analogous to windows 140-1 and 140-2. Thus, optical access and RF access is provided via windows 540-1 and 540-2 and apertures 522 and 524. In some embodiments, aperture 522 and/or 524 may be coupled with an antenna or other mechanism for guiding RF radiation. In some embodiments, interaction chamber 520 may be configured as a waveguide. Apertures 526 couple interaction chamber 520 with source chamber 530. Thus, quantum particles (not shown in FIGS. 5A-5D) may enter interaction chamber through apertures 526. Aperture 528 and window 540-4 allow for fluorescence to exit interaction chamber 520. Thus, the atomic fluorescence, which is typically isotropic, may be collected by optics in region 506. In some embodiments, interaction chamber 520 is configured to redirect fluorescence traveling in other directions to exit interaction chamber via window 540-4/aperture 528.

Vacuum cell 500 operates in an analogous manner to vacuum cell 100. Consequently, vacuum cell 500 may share the benefits of vacuum cell 100, 200, 300, and/or 400. For example, because vacuum cell 500 is metallic, vacuum cell 500 may be more robust and easier to fabricate than a conventional glass cell while remaining small. A quantum RF detector using vacuum cell 500 may be more readily deployable. Use of a high conductivity coating (or conductive metal housing 510) may reduce RF losses. Because windows 540 may be small and thin losses and/or distortions due to RF radiation entering and/or leaving interaction chamber 520 may be reduced. Consequently, the performance, manufacturability, and robustness of a quantum RF detector using metallic vacuum cell 500 may be improved.

Figure 6:
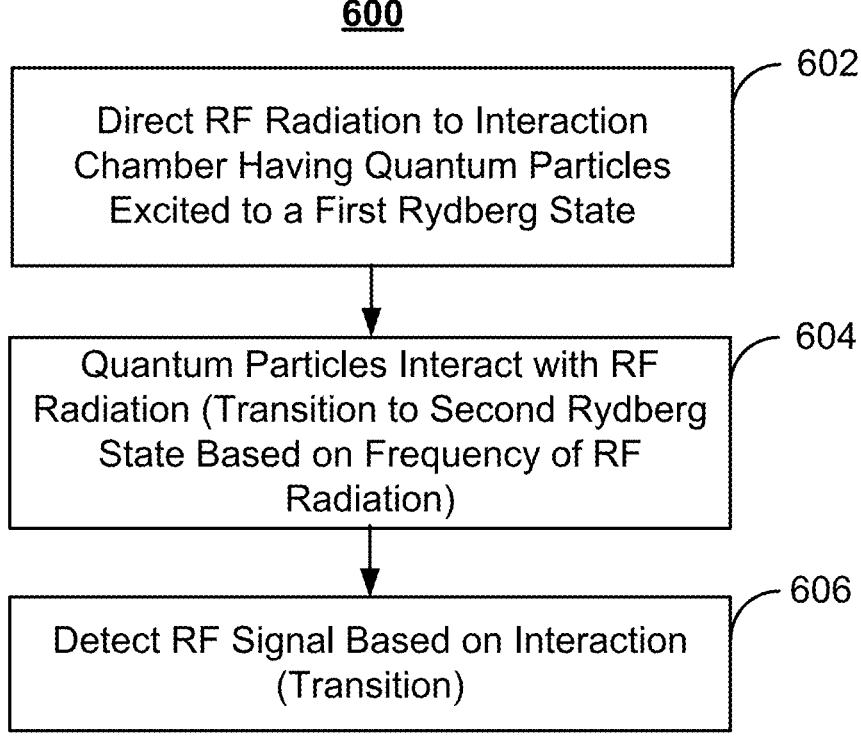
FIG. 6 is a flow-chart depicting a method for using a quantum RF detector.

FIG. 6 is a flow-chart depicting method 600 for using a quantum RF detector including an integrated vacuum cell. Method 600 is described in the context of vacuum cell 100. However, method 600 may be used in conjunction with another quantum RF detector using other vacuum cells, such as vacuum cell(s) 200, 300, and/or 500 and/or quantum RF detector 400.

RF radiation is directed to an interaction chamber having quantum particles excited to a desired state, at 602. In some embodiments, the quantum particles are excited to a first Rydberg state as part of or prior to 602. In some embodiments, the Rydberg states of the quantum particles are tuned. Tuning may be accomplished via a DC electric field that shifts the energy state. The tuning is utilized to provide the transitions between Rydberg states that correspond to the frequency of the RF signal desired to be detected. The quantum particles are exposed to the RF radiation at 602. At 604, the quantum particles interact with the RF radiation. In some embodiments, quantum particles transition to a second Rydberg state based on the frequency of the RF signal, at 604. Based on this interaction between the RF radiation and the quantum particles, the RF radiation is detected, at 606. In some embodiments, the populations of quantum state particles in the first and second Rydberg states may be used to detect the RF radiation. For example, EIT or atomic fluorescence may be used to detect the RF radiation at 606.

For example, method 600 may be used with vacuum cell 100. RF radiation may be directed toward interaction chamber 120, at 602. Thus, RF radiation may enter interaction chamber 120 via window 140-1. As part of or prior to 602, quantum particles 112 may be excited to a desired high energy state (e.g. the desired Rydberg state). At 604, the RF radiation interacts with quantum particles 112 in interaction chamber 120. As a result of the interaction, some quantum particles 112 may transition to other quantum states. At 606, this interaction is used to detect the RF radiation. For example, EIT and/or atomic fluorescence may be used to determine the transitions undergone by quantum particles.

Using method 600, the benefits of an integrated, metallic vacuum cell may be achieved. For example, because the vacuum cell used is metallic, the quantum RF detector using method 600 may be more robust and easier to fabricate than a quantum RF detector using a conventional glass cell. A quantum RF detector using method 600 may be more readily deployable. Use of a high conductivity coating (or conductive metal housing) may reduce RF losses. Because windows through which the RF radiation enters the interaction chamber may be small and thin, losses and/or distortions due to RF radiation entering and/or leaving the interaction chamber may be reduced. Consequently, a quantum RF detector using method 600 may have improved sensitivity. Thus, the benefits of using an integrated metallic vacuum cell, such as vacuum cells 100, 200, 300, 400, and/or 500 may be realized.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A radio frequency (RF) radiation detection system, comprising:
   a metallic vacuum cell including dispenser chamber and an interaction chamber, the dispenser chamber configured to retain a quantum particle source, the interaction chamber communicatively coupled with the dispenser chamber, the interaction chamber having at least one aperture therein and being configured to support the RF radiation, the vacuum chamber being hermetically sealed;
   at least one RF radiation access window coupled with and sealing the at least one aperture.

2. The RF radiation detection system of claim 1, wherein the interaction chamber further includes at least one optical access window.

3. The RF radiation detection system of claim 2, wherein the at least one optical access window is a portion of the at least one RF access window.

4. The RF radiation detection system of claim 1, wherein the interaction chamber includes a coating having a conductivity less than a metallic vacuum cell conductivity.

5. The RF radiation detection system of claim 1, wherein the at least one RF radiation access window includes a barrier layer, the barrier layer reducing absorption of quantum particles by the at least one RF radiation access window.

6. The RF radiation detection system of claim 1, wherein the interaction chamber is configured as a resonator for the RF radiation or as a waveguide for the RF radiation.

7. The RF radiation detection system of claim 6, wherein the interaction chamber is configured as the waveguide and wherein the metallic vacuum cell is coupled with at least one RF waveguide.

8. The RF radiation detection system of claim 1, wherein the metallic vacuum cell further includes:

an ion pump coupled with the dispenser chamber and the interaction chamber.

9. A radio frequency (RF) radiation detection system, comprising:

an RF waveguide;

a stainless steel vacuum cell coupled with the RF waveguide, the stainless steel vacuum cell including dispenser chamber and an interaction chamber and being hermetically sealed, the dispenser chamber configured to retain a quantum particle source, the interaction chamber communicatively coupled with the dispenser chamber, the interaction chamber having at least one aperture therein and being configured to support the RF radiation, the interaction chamber including a copper coating;

at least one glass RF radiation access window coupled with and hermetically sealing the at least one aperture, the at least one glass RF radiation access window having a barrier layer on the at least one RF radiation access window.

10. A method, comprising:

directing radio frequency (RF) radiation to an interaction chamber of a metallic vacuum cell, the metallic vacuum cell including the interaction chamber and a dispenser chamber and being hermetically sealed, the dispenser chamber configured to retain a quantum particle source, the dispenser chamber communicatively coupled with the interaction chamber, the interaction chamber having at least one aperture therein and being configured to support the RF radiation, the RF radiation being transmitted into the interaction chamber through at least one RF radiation access window coupled with and hermetically sealing the at least one aperture, the RF radiation interacting with quantum particles in the interaction chamber; and detecting the RF radiation based on an interaction between the quantum particle and the RF radiation.

11. The method of claim 10, wherein the detecting includes at least one of detecting a fluorescence of the quantum particles and detecting based on electromagnetically induced transparency of a probe beam transiting the interaction chamber.

12. The method of claim 10, wherein the interaction chamber further includes at least one optical access window.

13. The method of claim 12, wherein the at least one optical access window is a portion of the at least one RF access window.

14. The method of claim 10, wherein the interaction chamber includes a coating having a conductivity less than a metallic vacuum cell conductivity.

15. The method of claim 10, wherein the at least one RF radiation access window includes a barrier layer, the barrier layer reducing absorption of the quantum particles by the at least one RF radiation access window.

16. The method of claim 10, wherein the interaction chamber is configured as a resonator for the RF radiation or as a waveguide for the RF radiation.

17. The method of claim 16, wherein the interaction chamber is configured as the waveguide and wherein the metallic vacuum cell is coupled with at least one RF waveguide.

18. The method of claim 10, wherein the metallic vacuum cell further includes:

an ion pump coupled with the interaction chamber and the dispenser chamber.

* * * * *